US012568574B2

(12) United States Patent (10) Patent No.: US 12,568,574 B2
Ohmori (45) Date of Patent: Mar. 3, 2026

(54) CIRCUIT BOARD

(71) Applicant: Panasonic Intellectual Property Management Co., Ltd., Osaka (JP)

(72) Inventor: Chikara Ohmori, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 223 days.

(21) Appl. No.: 18/551,656

(22) PCT Filed: Feb. 8, 2022

(86) PCT No.: PCT/JP2022/004781
§ 371 (c)(1),
(2) Date: Sep. 21, 2023

(87) PCT Pub. No.: WO2022/209311
PCT Pub. Date: Oct. 6, 2022

(65) Prior Publication Data
US 2024/0196524 A1 Jun. 13, 2024

(30) Foreign Application Priority Data
Mar. 31, 2021 (JP) ................................. 2021-059175

(51) Int. Cl.
*H05K 1/02* (2006.01)
(52) U.S. Cl.
CPC ......... *H05K 1/0259* (2013.01); *H05K 1/0233* (2013.01); *H05K 2201/0179* (2013.01)

(58) Field of Classification Search
CPC ............... H05K 1/0259; H05K 1/0233; H05K 2201/0179
See application file for complete search history.

(56) References Cited

U.S. PATENT DOCUMENTS 5,340,641 A * 8/1994 Xu .......................... H01C 7/105
428/209
2009/0251843 A1 10/2009 Hironaka
2019/0355959 A1 11/2019 Ro

FOREIGN PATENT DOCUMENTS

DE 112007001369 B4 1/2012
EP 2009718 A2 12/2008
(Continued)

OTHER PUBLICATIONS

Extended Supplementary European Search Report dated Aug. 26, 2024, issued in counterpart Application No. 22779540.8. (7 pages).
(Continued)

*Primary Examiner* — Jeremy C Norris
(74) *Attorney, Agent, or Firm* — WHDA, LLP

(57) ABSTRACT

A circuit board includes a board, an interface formed on the board, a discharge wiring pair formed on the board and having a first discharge wire connected to the interface and a second discharge wire having a second tip portion facing a first tip portion of the first discharge wire with an interval, an electronic component installed in a signal path connected to the interface, a ground path connected to the second discharge wire, and a discharge induction unit configured to induce discharge between the discharge wiring pair by making a current having a frequency based on a voltage waveform of static electricity to be discharged flow more easily in the discharge wiring pair than in the signal path.

9 Claims, 5 Drawing Sheets

(56) References Cited

FOREIGN PATENT DOCUMENTS

| | | |
|---|---|---|
| JP | 58-039068 U | 3/1983 |
| JP | 2007-329003 | 12/2007 |
| JP | 2013-148753 | 8/2013 |
| JP | 2014-090042 | 5/2014 |
| JP | 2020-506506 | 2/2020 |

OTHER PUBLICATIONS

International Search Report of PCT application No. PCT/JP2022/004781 dated Apr. 26, 2022.

* cited by examiner

Several GHz band, peak of KV order

Time(20ns/div.)

CIRCUIT BOARD

CROSS-REFERENCE TO RELATED APPLICATIONS

This application is a U.S. national stage application of the PCT International Application No. PCT/JP2022/004781 filed on Feb. 8, 2022, which claims the benefit of foreign priority of Japanese patent application No. 2021-059175 filed on Mar. 31, 2021, the contents all of which are incorporated herein by reference.

TECHNICAL FIELD

The present disclosure relates to a circuit board.

BACKGROUND ART

Conventionally, there is a circuit board described in PTL 1. The circuit board includes a connector, a capacitor electrically connected to a terminal of the connector, a Zener diode electrically connected to another terminal of the connector, and a display. The connector, the capacitor, the Zener diode, and the display are mounted on the board. The capacitor and the Zener diode prevent static electricity from the outside from reaching the display via the connector. As a result, the display is prevented from being damaged by static electricity from the outside.

CITATION LIST

Patent Literature

PTL 1: Unexamined Japanese Patent Publication No. 2013-148753

SUMMARY OF THE INVENTION

An antistatic elements, that is, a capacitor or a Zener diode is one cause of an increase in size of a circuit board, an increase in cost, and an increase in failure rate.

Therefore, an object of the present disclosure is to provide a circuit board that can reduce the number of antistatic elements and is not easily affected by static electricity.

In order to solve the above problem, a circuit board of the present disclosure includes a board, an interface formed on the board, a discharge wiring pair formed on the board and having a first discharge wire connected to the interface and a second discharge wire having a second tip portion facing a first tip portion of the first discharge wire with an interval, an electronic component installed in a signal path connected to the interface, a ground path connected to the second discharge wire, and a discharge induction unit configured to induce discharge between the discharge wiring pair by making a current having a frequency based on a voltage waveform of static electricity to be discharged flow more easily in the discharge wiring pair than in the signal path.

Note that, in the present specification, the term "directly electrically connected" indicates direct connection, and indicates electrical connection only by wiring without an electronic component.

According to the circuit board of the present disclosure, the number of antistatic elements can be reduced, and the circuit board is hardly affected by static electricity.

DESCRIPTION OF EMBODIMENT

Figure 1:
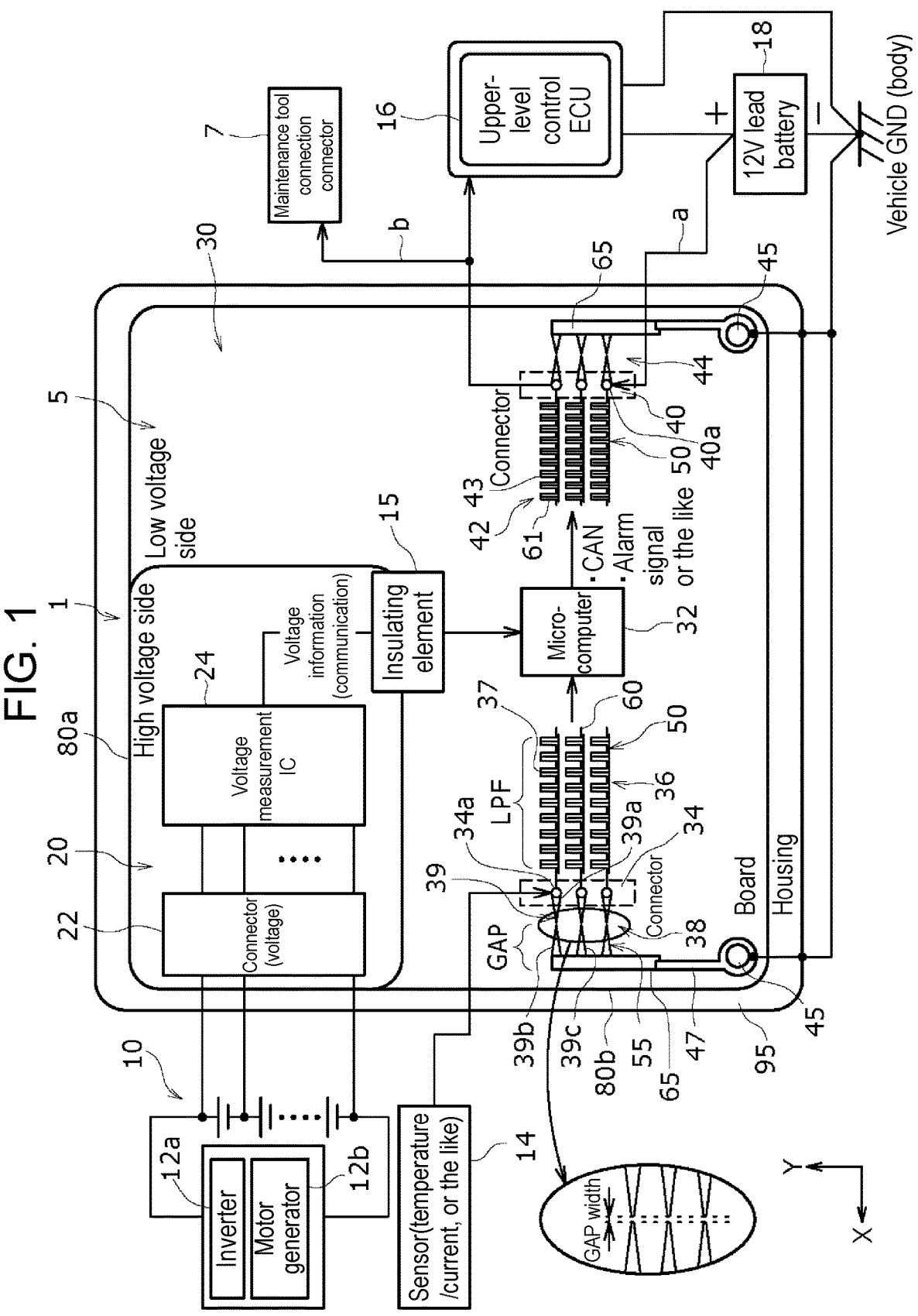
FIG. 1 is a schematic diagram illustrating an outline of a circuit board of a battery pack system for mounting on an electric vehicle according to an exemplary embodiment of the present disclosure.

Exemplary embodiments according to the present disclosure will be described below in detail with reference to the accompanying drawings. Note that in a case where a plurality of exemplary embodiments and modified examples are included in the following, it is assumed from the beginning to construct a new exemplary embodiment by appropriately combining feature parts of them. In the following example, the same configurations are given the same reference marks in the drawings, and redundant descriptions are omitted. A plurality of drawings include schematic views, and dimensional ratios between lengths, widths, and heights of each member do not necessarily coincide among different drawings. Those configuration elements described in the following that are not recited in independent claims representing the highest concept are illustrated herein as optional configuration elements and are not essential. In the present description, the term "substantially" is used in the same meaning as the term "roughly speaking", and the requirement "substantially . . . " is satisfied when a human sees it almost as . . . . For example, the requirement of a substantially circular shape is satisfied when a human sees it almost as a circular shape.

FIG. 1 is a schematic diagram illustrating an outline of circuit board 1 of a battery pack system for mounting on an electric vehicle according to an exemplary embodiment of the present disclosure. As illustrated in FIG. 1, circuit board 1 has a signal path and a power supply path formed by mounting circuit components on a conductor wiring pattern formed on insulator board 5, and includes high-voltage circuit 20, low-voltage circuit 30, and insulating element 15. The electric vehicle includes power supply 10, inverter 12a, motor generator 12b, and various sensors 14. Power supply 10 is a storage battery, and is configured by, for example, connecting a plurality of battery modules in series, the battery modules being configured by connecting a plurality of battery cells in combination in at least one of in series and in parallel. The battery cell is constituted by a secondary battery of a cylindrical shape, a square shape, or a pouch shape, for example, a lithium ion battery. DC power from power supply 10 is converted into AC power by inverter 12a, and then supplied to motor generator 12b, whereby the DC power is converted into power. Alternatively, at the time of power regeneration, inverter 12*a* converts AC power generated by the rotational power of motor generator 12*b* into DC power, and then power supply 10 is charged with the DC power.

High-voltage circuit 20 includes high-voltage connector 22 and voltage measurement integrated circuit (IC) 24. High-voltage connector 22 constitutes an interface on the input side of circuit board 1 to which a plurality of predetermined voltages of power supply 10 is input, and has a plurality of input/output terminals according to a position where the plurality of voltages of power supply 10 is detected. Voltage measurement IC 24 is installed in a signal path formed by a signal line connected to an output terminal of high-voltage connector 22. Voltage measurement IC 24 constitutes a voltage measurement circuit. Power supply 10 has, for example, a high electromotive force of about 400V. Voltage measurement IC 24 receives and measures a DC output voltage output from each of the plurality of battery modules constituting power supply 10 via high-voltage connector 22, and outputs a signal or information indicating the measured output voltage to microcomputer 32 of low-voltage circuit 30 via insulating element 15. Although not illustrated, a clearance for insulating high-voltage circuit 20 and low-voltage circuit 30 from each other is provided at the boundary between the high-voltage circuit and the low-voltage circuit, and the high-voltage circuit is floating from the ground potential. Insulating element 15 includes, for example, a transformer, a photocoupler, or the like, and is provided to insulate high-voltage circuit 20 and low-voltage circuit 30 from each other in terms of direct current and to perform communication.

In addition to microcomputer 32, low-voltage circuit 30 includes first low-voltage connector 34, first low-pass filter 36, first discharge wire pair 38, second low-voltage connector 40, second low-pass filter 42, and second discharge wiring pair 44. First low-voltage connector 34 includes a plurality of terminals 34*a*. To terminal 34*a* of first low-voltage connector 34, signal lines from various sensors 14, for example, a signal line from a temperature sensor (for example, a thermistor) that detects a current flowing to power supply 10 and a power supply temperature, and the like are connected. Microcomputer 32 is installed on signal path 60 formed by a signal line connected to terminal 34*a* of first low-voltage connector 34, and microcomputer 32 is installed on signal path 61 formed by a signal line connected to terminal 40*a* of second low-voltage connector 40.

Detection signals from various sensors 14 are output to microcomputer 32 via first low-voltage connector 34 serving as an interface on the input side of circuit board 1. A communication signal communicated from high-voltage circuit 20 via insulating element 15 is also output to microcomputer 32. Based on these signals, microcomputer 32 outputs a controller area network (CAN) signal and an alarm signal via second low-voltage connector 40, and outputs the signals to upper-level control electronic control unit (ECU) 16 of the battery pack system. Second low-voltage connector 40 constitutes an interface on the output side of circuit board 1. CAN is a communication standard for transversely connecting electronic circuits and devices in a machine such as an automobile. In addition, the alarm signal is a signal for notifying the outside of an abnormal state when abnormality of power supply 10 or abnormality of circuit board 1 occurs. Upon receiving the alarm signal, upper-level control ECU 16 performs, for example, control to stop the operation of a device related to the alarm signal. 12 V lead battery 18 (auxiliary battery) of the electric vehicle supplies electric power to upper-level control ECU 16 and general electric components such as a headlight and an air conditioner.

Next, configurations and operations of first low-pass filter 36, first discharge wire pair 38, second low-pass filter 42, and second discharge wiring pair 44 will be described. There is a possibility that static electricity enters circuit board 1 via all wirings connected to connectors 22, 34, 40. Here, in a case where the system is set up, all the wirings connected to high-voltage circuit 20 serving as a static electricity entry point of high-voltage circuit 20 are arranged at positions that cannot be easily touched by the user, covers, and the like in order to prevent electric shock. Therefore, the possibility of receiving static electricity is extremely small with respect to low-voltage circuit 30. In addition, due to the high voltage of power supply 30 (main stream electric vehicle 400 V), high-voltage circuit 20 needs to have a large GAP clearance so as not to leak electricity, and this GAP clearance disadvantageously discharges static electricity, and the effectiveness of discharging static electricity by providing the GAP is not high. Since the voltage of low-voltage circuit 30 is based on 12 V lead battery 18 (auxiliary battery), a GAP having a smaller GAP clearance than a high voltage can be used, so that a GAP effective for discharging static electricity can be obtained.

Since low-voltage circuit 30 is connected to a negative potential of 12 V lead battery 18, that is, a vehicle body connected to the negative potential, that is, so-called body grounded, static electricity having entered from connectors 34, 40 may follow a path through which the static electricity passes through low-voltage circuit 30 to the body, and thus may damage electronic components in low-voltage circuit 30. More specifically, for example, when an operator charged with static electricity touches the battery+terminal for vehicle maintenance or the like, static electricity is applied to the power supply circuit of board 5 via path a.

Alternatively, when a maintenance tool is connected to the vehicle and the maintenance tool connection connector is touched, static electricity is applied to the CAN circuit on circuit board 5 via path b. In such a case, if measures against static electricity are not taken, an electronic component of low-voltage circuit 30, for example, an electronic component including microcomputer 32 may be damaged by a current based on static electricity.

First and second discharge wiring pairs 38 and 44 are provided to protect the electronic components of low-voltage circuit 30 by discharging such static electricity and releasing it outside circuit board 1, In addition, first and second low-pass filters 36, 42 are provided to suppress or prevent a current based on such static electricity flowing to the electronic component side of low-voltage circuit 30. Since first discharge wire pair 38 has the same configuration as that of second discharge wiring pair 44, the configuration and operation of first discharge wire pair 38 will be described, and the description of the configuration and operation of second discharge wiring pair 44 will be omitted. In addition, since the configuration of first low-pass filter 36 is similar to the configuration of second low-pass filter 42, the configuration and operation of first low-pass filter 36 will be described, and the description of the configuration and operation of second low-pass filter 42 will be omitted.

Figure 2:
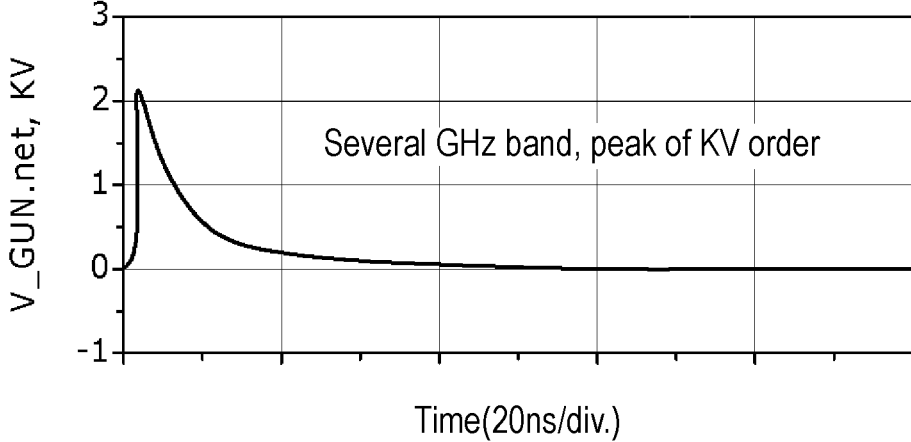
FIG. 2 is a graph showing a typical voltage waveform of static electricity.

FIG. 2 is a graph illustrating an example of a voltage waveform of static electricity discharged to the device. As illustrated in FIG. 2, a typical electrostatic voltage waveform has a voltage waveform having a steep voltage change rising and falling in several nanoseconds, and has a frequency of a few GHz (gigahertz) band. In the example illustrated in FIG. 2, the voltage waveform of static electricity has a peak on the order of kV.

First discharge wire pair 38 has the same number of discharge wiring pairs (GAP) 39 as the number of terminals 34a of first low-voltage connector 34. Discharge wiring pair 39 includes first discharge wire 39a electrically connected directly to terminal 34a of first low-voltage connector 34, and second discharge wire 39b having a second tip portion facing a first tip portion of first discharge wire 39a with a predetermined interval. First discharge wire 39a and second discharge wire 39b have substantially the same line-symmetric shape and have a substantially isosceles triangular planar shape tapered toward the tip, and the tip portions thereof face each other with an interval. The interval (GAP width) between the tips of first discharge wire 39a and second discharge wire 39b is appropriately determined according to the application, and is appropriately determined according to the voltage of static electricity to be discharged. The GAP width depends on the material of the board, the degree of contamination, the atmospheric pressure, and the like, but is roughly about 0.1 mm at a GAP potential difference of 10V.

As illustrated in FIG. 1, board 5 has a substantially rectangular planar shape including a pair of first outer edges 80a extending in a first direction and a pair of second outer edges 80b extending in a second direction orthogonal to the first direction. In FIG. 1, the first direction is indicated as the X direction, and the second direction is indicated as the Y direction. First low-voltage connector 34 has a rectangular shape with a long side in the Y direction, and each discharge wiring pair 39 is disposed between first low-voltage connector 34 and second outer edge 80b located outside the first low-voltage connector. First discharge wire 39a and second discharge wire 39b of each discharge wiring pair 39 extend in the X direction at the same position in the Y direction. Therefore, due to such arrangement of discharge wiring pair 39, discharge wiring pair 39 is formed at the end portion of circuit board 1 not suitable for arranging the element component, whereby the dead space of circuit board 1 is effectively utilized.

Board 5 is installed in housing 95, and is attached to housing 95 serving as an attached portion by screw 45. Housing 95 is attached to a vehicle body. Second discharge wire 39b of discharge wiring pair 39 is electrically connected to screw 45 via wiring 47. Therefore, in a case where housing 95 is made of a metal material of a conductor, ground path 65 is formed in second discharge wire 39b by screw 45, housing 95, and the vehicle body, and the current flowing through second discharge wire 39b by the discharge is discharged to the vehicle body via screw 45 and housing 95. Second discharge wire 39b is a land of discharge wiring pair (GAP) 39. Second discharge wire 39b may be electrically connected to the vehicle body by wire wiring.

Next, first low-pass filter 36 will be described. First low-pass filter 36 includes the same number of low-pass filters 37 as the number of terminals of first low-voltage connector 34. Low-pass filter 37 includes only wiring. A terminal on one side of each low-pass filter 37 is directly electrically connected to terminal 34a of first low-voltage connector 34. As illustrated in FIG. 1, low-pass filter 37 can be configured by, for example, meander wiring (meandering wiring). The meander wiring can change the reflection characteristic and the passage characteristic in the frequency band of the signal by adjusting the coupling length, the number of folds, the wiring pitch, and the entire length.

By appropriately adjusting the cutoff frequency according to the frequency of the voltage waveform based on static electricity to be discharged, low-pass filter 37 does not pass a high frequency (static electricity) signal but passes an input signal of low-frequency microcomputer 32, and more specifically, does not pass only a signal having a voltage waveform of a frequency in a gigahertz (GHz) band of the frequency of the voltage waveform based on static electricity. Specifically, in a case where an operator charged with static electricity touches the maintenance connector terminal or the battery negative terminal at the time of connecting the maintenance tool or replacing the battery, the static electricity reaches terminal 40a via paths a and b. In a case where a countermeasure is taken by induction unit 50 and discharge wiring pair 44, discharge of static electricity to the outside of the board can be guided, and the possibility of element breakage inside the board can be reduced. Static electricity is discharged to the outside of the board by using ground path 65. The static electricity is discharged to the vehicle body via screw 45 that fixes board 5 to housing 95 and housing 95.

To summarize, one terminal of discharge wiring pair (GAP) 39 is directly connected to each terminal (signal 1 line) 34a of first low-voltage connector 34 only by wiring, and one terminal of low-pass filter 37 is directly connected only by wiring. Therefore, when static electricity reaches each terminal 34a of first low-voltage connector 34 from the outside, the static electricity can be induced to discharge wiring pair 39 by low-pass filter 37, and discharge wiring pair 39 can be reliably discharged. That is, the current having the frequency based on the voltage waveform of the static electricity discharged by low-pass filter 37 can easily flow to discharge wiring pair 39 as compared with signal path 60 to microcomputer 32.

Therefore, by discharge wiring pair 39 and low-pass filter 37, it is possible to effectively suppress or prevent static electricity from reaching the electronic component electrically connected to the other-side terminal of low-pass filter 37, and it is possible to effectively suppress or prevent the electronic component from being damaged by static electricity. First and second low-pass filters 36, 42 are included in discharge induction unit 50 that promotes discharge of electric charges based on static electricity and having reached the terminal of first low-voltage connector 34 between discharge wiring pair 39, 44.

Note that the CAN signal is a signal having a voltage waveform with a frequency of a maximum of several megahertz (MHz), and the alarm signal is a signal having a voltage waveform with a frequency of several kilohertz (KH). Therefore, the CAN signal and the alarm signal output from microcomputer 32 pass through low-pass filter 43 of second low-pass filter 42 without any problem, and reach upper-level control ECU 16 outside circuit board 1 almost without attenuation.

Figure 3:
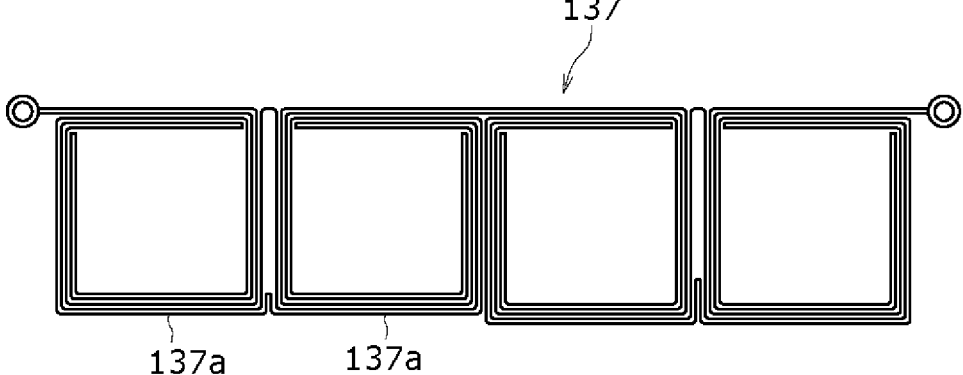
FIG. 3 is a view illustrating a shape of a low-pass filter of a modification example in plan view.

Note that the case where low-pass filters 37, 43 are configured by meander wiring has been described. However, the low-pass filter can be configured by wiring lines having other shapes. FIG. 3 is a diagram illustrating a shape (shape as viewed along the thickness of the board) of low-pass filter 137 of the modification example in plan view. As illustrated in FIG. 3, low-pass filter 137 can also be configured by wiring in which a plurality of wiring portions 137a wound in a substantially rectangular shape is connected in series.

In the present disclosure, since low-pass filters 37, 43, 137 do not include an electronic component such as a capacitor and include only wiring, in the case of a multilayer board, low-pass filters 37, 43, 137 can be arranged in an inner layer of board 5. Specifically, when low-pass filters 37, 43, 137 have a large occupied area in plan view, two or more low-pass filters 37, 43, 137 electrically connected to two or more different terminals 34a, 40a of the same connectors 34, 40 may be disposed on different layers of the multilayer board. More specifically, a multilayer board such as a four-layer board or a six-layer board may be adopted as board 5, and one or more low-pass filters 37, 43, 137 arranged in the inner layer may be electrically connected to the inner layer to be arranged using a via hole. In this way, circuit board 1 of the present disclosure can be made compact as compared with a conventional circuit board using an antistatic component.

Next, another example of the discharge induction unit that promotes discharge between discharge wiring pair 39 will be described.

Figure 4:
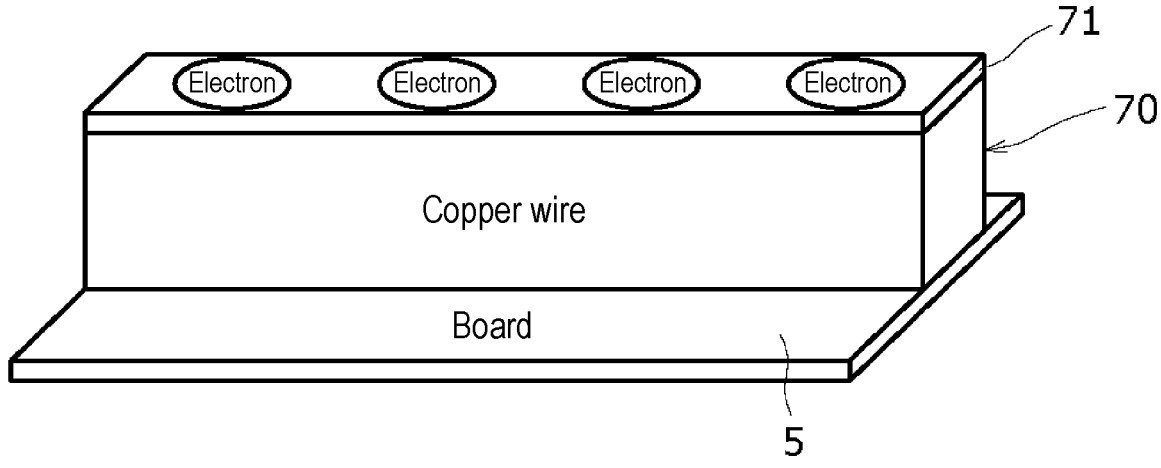
FIG. 4 is a schematic diagram illustrating a signal of static electricity propagating through a skin region of a copper wire.

In general, the skin effect is widely known, and the depth of the current conduction path becomes shallower as the frequency of the signal increases. In the case of copper wiring, a signal having a frequency of 1 GHz propagates through a very shallow surface layer of about 2 μm. Therefore, as illustrated in FIG. 4, it can be seen that a signal of static electricity having a frequency in the GHz band propagates through skin region 71 of copper wire 70.

Figure 5:
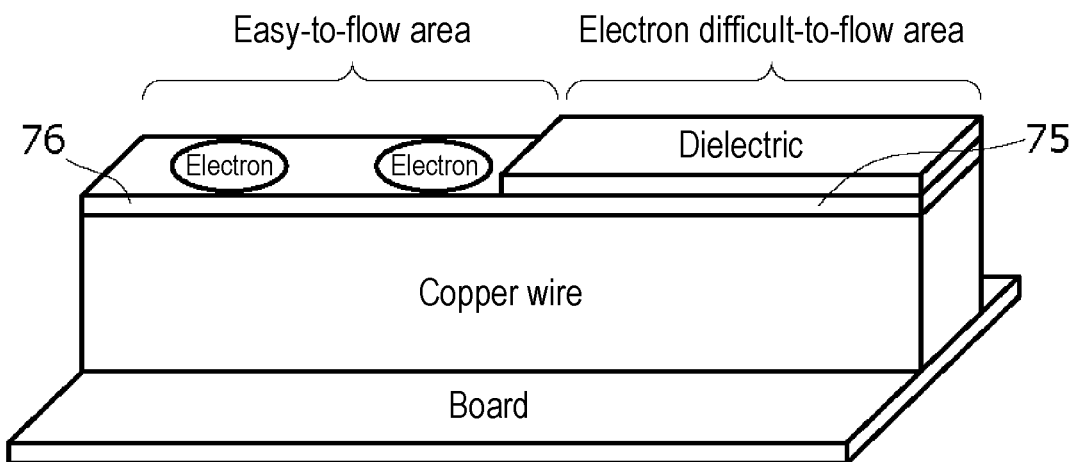
FIG. 5 is a diagram for illustrating the flow of electrons when moving between a region whose surface is covered with a dielectric and a region whose surface is not covered with a dielectric.

In a case where a generally known material having a high dielectric constant is adjacent to the metal wiring, dielectric loss increases. That is, when the surface layer processing using the dielectric is performed, the higher the frequency of the signal, the higher the degree of attenuation when the signal propagates. FIG. 5 is a diagram for illustrating the flow of electrons when moving region 75 whose surface is covered with a dielectric and region 76 whose surface is not covered with a dielectric. As illustrated in FIG. 5, a signal having a particularly high frequency is less likely to propagate through region 75 subjected to the surface treatment with the dielectric, and is likely to propagate through region 76 not subjected to the surface treatment with the dielectric.

That is, by appropriately selecting surface layer processing for a signal having a high frequency, it is possible to propagate the signal without attenuating the signal and attenuate the signal. More specifically, the dielectric constant of air is 1, and the dielectric constant of the resist is 4 to 5. In the present embodiment, the surface layer processing with the resist is performed on the wiring surface from terminal 34a of first low-voltage connector 34 to microcomputer 32 near low-pass filter 37, and the surface layer processing with the resist is not performed on all the portions (including discharge wiring pair 39) of the wiring on board 5 from terminal 34a of first low-voltage connector 34 to screw 45 on discharge wiring pair 39 side from terminal 34a of first low-voltage connector 34.

Therefore, static electricity having reached terminal 34a of first low-voltage connector 34 is less likely to flow to the wiring near low-pass filter 37 as compared with the wiring near discharge wiring pair 39. Discharge wiring pair 39 may be subjected to leveler processing. The leveler treatment is a surface treatment in which molten solder is dip-coated, and excess solder is blown off with hot air to be finished. The surface of discharge wiring pair 39 is in contact with air. A dielectric portion having a high dielectric constant does not exist from terminal 34a of first low-voltage connector 34 on the wiring on board 5 near discharge wiring pair 39 and on discharge wiring pair 39. In the wiring that is not resist-treated, that is, in which the metal foil (for example, copper foil) is exposed, a metal oxide film (for example, a copper oxide film) is generated, and this also has a high dielectric constant. In the leveler processing, since the metal wiring surface (for example, a copper wiring surface) is covered with the solder layer, oxidation hardly proceeds, and a thick oxide film exhibiting a high dielectric constant is hardly generated on the solder surface.

The resist covering the wiring surface from terminal 34a of first low-voltage connector 34 near low-pass filter 37 constitutes a covered portion in which the surface of the conductor portion electrically connecting terminal 34a of first low-voltage connector 34 and the electronic component is covered with a dielectric film having a dielectric constant higher than that of air. Discharge induction unit 50 includes dielectric structure 55 formed by the resist constituting the dielectric covered portion and the non-covered portion that does not coat the conductive pattern of discharge wiring pair 39 with the dielectric film.

As described above, circuit board 1 includes board 5, connectors (interfaces) 30, 40 formed on board 5, discharge wiring pair 39 formed on board 5 and having first discharge wire 39a connected to the interface and second discharge wire 39b having the second tip portion facing the first tip of first discharge wire 39a with an interval, the electronic component (in the above exemplary embodiment, the electronic component included in microcomputer 32) installed in signal path 60 connected to the interface, ground path 65 connected to second discharge wire 39, and discharge induction unit 50 that induces discharge between discharge wiring pair 39 by making a current of a frequency based on a voltage waveform of static electricity to be discharged flow more easily in the discharge wiring pair than in signal path 60.

Therefore, according to circuit board 1, signal path 60 to microcomputer 32 is a covered portion covered with the resist, and a current having a frequency based on the voltage waveform of static electricity discharged by forming a non-covered portion not covered with the resist near the discharge wiring pair 39 can easily flow to discharge wiring pair 39 as compared with signal path 60 to microcomputer 32. Therefore, since static electricity can be appropriately discharged between discharge wiring pairs 39 and appropriately discharged to the outside of circuit board 1, the number of antistatic elements can be reduced, and the element is hardly affected by static electricity.

In addition, discharge induction unit 50 may include filters 37, 43 configured by wiring formed on board 5 while suppressing passage of a current having a frequency based on a voltage waveform of static electricity, and filters 37, 43 may be formed on signal paths 60, 61.

According to this configuration, as will be described below, it is possible to realize miniaturization of circuit board 1, reduction in manufacturing cost, and reduction in failure rate. Specifically, FIG. 6 is a schematic diagram for briefly illustrating an antistatic structure in conventional circuit board 201, and FIG. 7 is a schematic diagram for briefly describing an antistatic structure in circuit board 1 having the present configuration.

Figure 6:
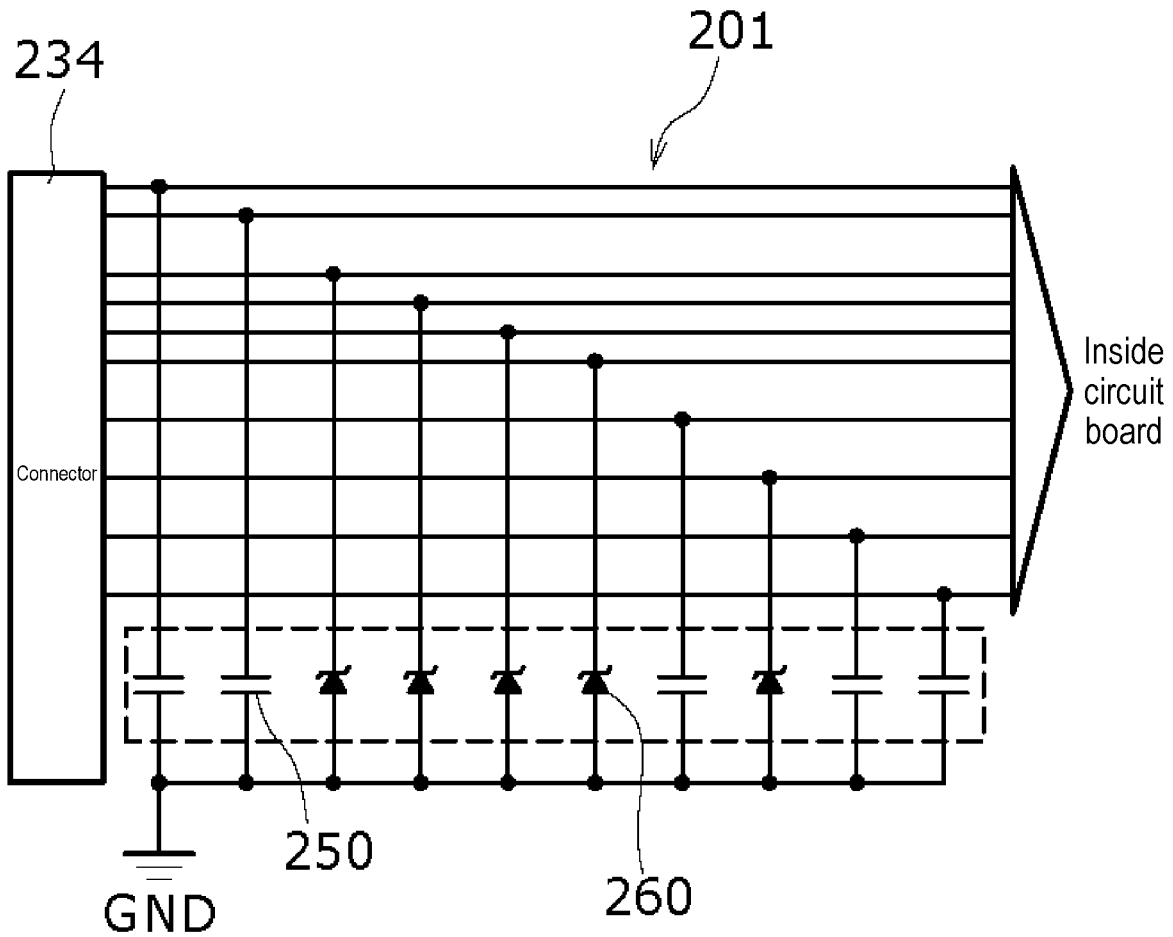
FIG. 6 is a schematic diagram for briefly describing an antistatic structure in a conventional circuit board.

As illustrated in FIG. 6, in conventional circuit board 201, capacitor 250 or Zener diode 260, which is an antistatic component, is electrically connected between each terminal of connector 234 and the ground, and charges caused by static electricity are accumulated in the antistatic components so that static electricity does not reach electronic components inside the circuit board. Capacitor 250 is used for a line that handles a signal having a low frequency, and Zener diode 260 is used for a line that handles a signal having a high frequency, such as a communication line, so that rounding of a waveform due to capacitance does not occur. However, in conventional circuit board 201, when the number of functions of the interface increases and the number of terminals of connector 234 increases, the number of electronic components for countermeasures against static electricity increases in proportion to the number of terminals, so that the board size, the manufacturing cost, and the failure rate increase.

Figure 7:
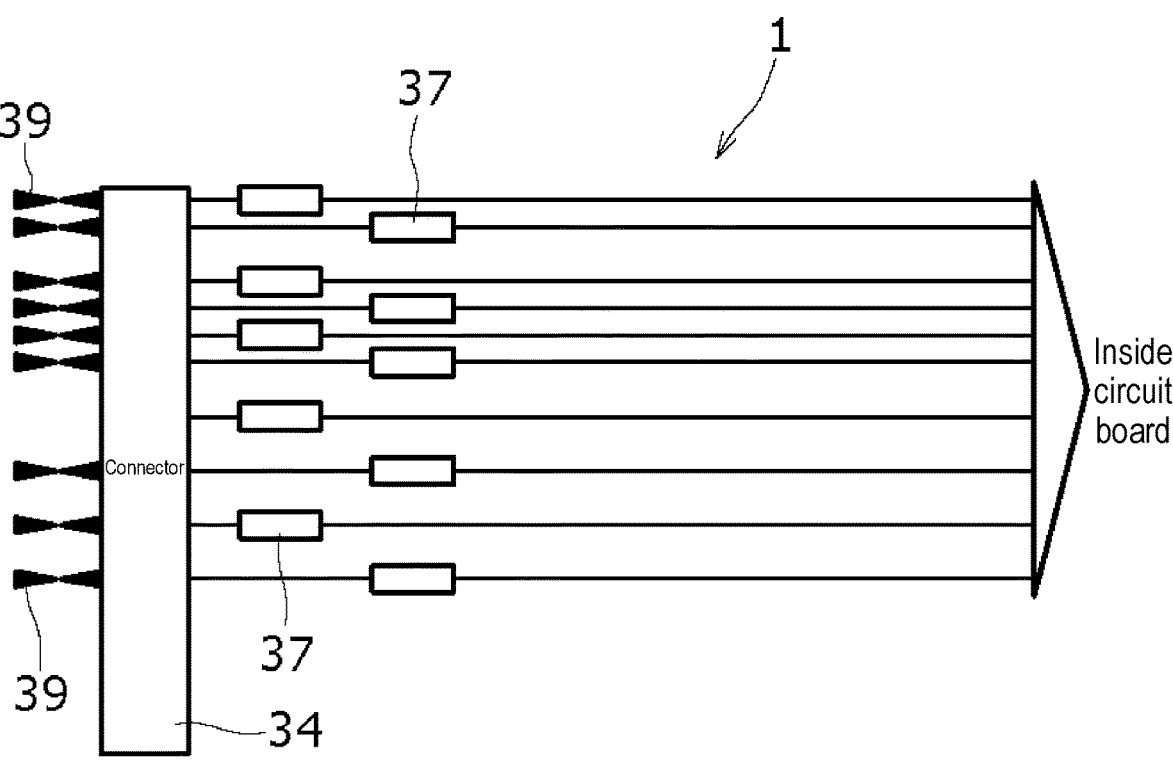
FIG. 7 is a schematic diagram for briefly describing an antistatic structure in the circuit board of the present exemplary embodiment.

On the other hand, as illustrated in FIG. 7, in circuit board 1 having the present configuration, filter 37 configured only with inexpensive wiring is used instead of the antistatic component, so that the manufacturing cost can be reduced. In addition, as described above, since filter 37 including only the wiring can be disposed on the inner layer of the multi-layer board unlike the electronic component for antistatic measures, a large installation area is not required, and downsizing of circuit board 1 can be realized. Furthermore, in circuit board 1 having the present configuration, since the number of electronic components for antistatic measures can be reduced, the failure rate can also be reduced.

In addition, discharge induction unit 50 may be formed of a covered portion that covers the surface of the conductor portion of signal path 60 with a dielectric film having a dielectric constant higher than that of air, and a non-covered portion that does not cover the conductive pattern of discharge wiring pair 39 with the dielectric film.

According to this configuration, discharge wiring pair 39 can appropriately discharge electricity, and static electricity can be reliably discharged to the outside of circuit board 1. In addition, it is possible to reduce the manufacturing cost of circuit board 1, downsize circuit board 1, and reduce the failure rate of circuit board 1.

In addition, the circuit board 1 may include high-voltage circuit 20 that has voltage measurement IC (voltage measurement circuit) 24 for measuring the voltage of power supply (storage battery) 10 including a plurality of battery cells and is floating from the ground potential, and low-voltage circuit 30 that is isolated from high-voltage circuit 20 in terms of direct current, has a power supply voltage lower than the power supply voltage of high-voltage circuit 20, and transmits a signal from high-voltage circuit 20 via insulating element 15. In addition, discharge wiring pair 39 may be formed in low-voltage circuit 30 without being formed in high-voltage circuit 20.

According to this configuration, the low-voltage electronic component can be reliably protected from static electricity.

Further, board 5 may have a substantially rectangular planar shape having a pair of first outer edges 80a extending in the X direction (first direction) and a pair of second outer edges 80b extending in the Y direction (second direction) orthogonal to the X direction. In addition, the shortest distance in the X direction between connector (interface portion) 30 and second outer edge 80b may be shorter than the shortest distance in the Y direction between connector 30 and first outer edge 80a. In the X direction, discharge wiring pair 39 may be disposed between connector 30 and second outer edge 80b located outside the connector.

According to this configuration, the electronic component is not disposed in the conventional circuit board, and discharge wiring pair 39 is disposed between connectors 34, 40, which are dead spaces in the conventional circuit board, and second outer edge 80b of board 5 located outside the connectors. Therefore, not only it is possible to efficiently suppress or prevent the static electricity from damaging the electronic components in circuit board 1, but also it is easy to realize significant miniaturization of circuit board 1.

Board 5 may be attached to the vehicle body (attached portion) by screw 45, and ground path 65 of second discharge wire 39b may be formed by screw 45.

According to this configuration, static electricity can be easily and inexpensively discharged to the outside of circuit board 1 using screw 45 for fixing board 5 to the attached portion.

Note that the present disclosure is not limited to the above-described exemplary embodiment and modified examples thereof, and various improvements and changes are possible within the matters described in the claims of the present application and the equivalent scope thereof.

For example, in the above exemplary embodiment, the case where discharge induction unit 50 of circuit board 1 includes first and second low-pass filters 36, 42 and dielectric structure 55 has been described, but the discharge induction unit of the circuit board may include only one of the above-described low-pass filter and the above-described dielectric structure.

The case where circuit board 1 includes high-voltage circuit 20, low-voltage circuit 30, and insulating element 15 has been described. However, the circuit board may not have the insulating element, and may have only one of the high-voltage circuit and the low-voltage circuit.

In addition, the case where discharge wiring pair 39 is disposed between connectors 34, 40 and second outer edge 80b of board 5 facing the connectors has been described. However, the discharge wiring pair may not be disposed between the connector and the outer edge of the board facing the connector.

Further, the case where board 5 is attached to the attached portion by screw 45 and second discharge wire 39b is electrically connected to screw 45 has been described. However, the second discharge wire may be electrically connected to the ground via a line that does not pass through a screw for attaching the board to the attached portion.

The case where the planar shape of circuit board 1 is substantially rectangular has been described. However, the planar shape of circuit board 1 may be any shape other than a rectangle. In addition, the case where circuit board 1 is an on-vehicle circuit board mounted on an electric vehicle using a battery as a power supply has been described. However, the circuit board of the present disclosure may be mounted on a device, a product, or a machine for any purpose, or may be mounted on an electric mobile body that is not a vehicle. For example, the circuit board of the present disclosure may be a circuit board mounted on an industrial machine, a circuit board mounted on an electrical appliance, or the like.

REFERENCE MARKS IN THE DRAWINGS

1: circuit board
5: board
10: power supply
15: insulating element
16: upper-level control ECU
18: 12 V lead battery
20: high-voltage circuit
22: high-voltage connector
30: low-voltage circuit
32: microcomputer
34: first low-voltage connector
34a: terminal of first low-voltage connector
36: first low-pass filter
37, 43: low-pass filter
38: first discharge wire pair 39: discharge wiring pair
39*a*: first discharge wire
39*b*: second discharge wire
39*c*: surface of discharge wiring pair
40: second low-voltage connector
40*a*: 2 terminal of low-voltage connector
42: second low-pass filter
44: second discharge wiring pair
45: screw
47: wiring
50: discharge induction unit
55: dielectric structure
60, 61: signal path
65: ground path
80*a*: first outer edge
80*b*: second outer edge
95: housing
137: low-pass filter
137*a*: wiring portion

The invention claimed is:

1. A circuit board comprising:
a board;
an interface disposed on the board;
a discharge wiring pair formed on the board and including (i) a first discharge wire connected to the interface and including a first tip part and (ii) a second discharge wire including a second tip part facing the first tip part of the first discharge wire with an interval;
an electronic component installed in a signal path connected to the interface;
a ground path connected to the second discharge wire; and
a discharge induction unit configured to induce discharge between the discharge wiring pair by making a current with a frequency based on a voltage waveform of static electricity to be discharged flow more easily in the discharge wiring pair than in the signal path,
wherein the discharge induction unit includes a filter that suppresses passage of a current with a frequency based on a voltage waveform of static electricity and includes a wiring disposed on the board, and
the filter is disposed on the signal path.

2. The circuit board according to claim 1, wherein the discharge induction unit includes a covered part that covers a surface of a conductor part of the signal path with a dielectric film with a dielectric constant higher than that of air, and a non-covered part that does not cover a conductive pattern of the discharge wiring pair with the dielectric film.

3. The circuit board according to claim 1, the board further comprising:
a high-voltage circuit including a voltage measurement circuit that measures a voltage of a storage battery including a plurality of battery cells and floating from a ground potential; and
a low-voltage circuit that is isolated from the high-voltage circuit in a direct current manner, includes a power supply voltage lower than a power supply voltage of the high-voltage circuit, and transmits a signal from the high-voltage circuit via an insulating element, wherein
the discharge wiring pair is not disposed in the high-voltage circuit but disposed in the low-voltage circuit.

4. The circuit board according to claim 1, wherein
the board is in a substantially rectangular planar shape including a pair of first outer edges being elongated in a first direction and a pair of second outer edges being elongated in a second direction orthogonal to the first direction, a shortest distance between the interface and the second outer edge in the first direction is shorter than a shortest distance between the interface and the first outer edge in the second direction, and
the discharge wiring pair is disposed between the interface and the second outer edge located outside the interface in the first direction.

5. The circuit board according to claim 1, wherein
the board is attached to an attached part of a conductor by a screw, and
a ground path of the second discharge wire includes the screw.

6. A circuit board comprising:
a board;
an interface disposed on the board;
a discharge wiring pair formed on the board and including (i) a first discharge wire connected to the interface and including a first tip part and (ii) a second discharge wire including a second tip part facing the first tip part of the first discharge wire with an interval;
an electronic component installed in a signal path connected to the interface;
a ground path connected to the second discharge wire;
a discharge induction unit configured to induce discharge between the discharge wiring pair by making a current with a frequency based on a voltage waveform of static electricity to be discharged flow more easily in the discharge wiring pair than in the signal path;
a high-voltage circuit including a voltage measurement circuit that measures a voltage of a storage battery including a plurality of battery cells and floating from a ground potential; and
a low-voltage circuit that is isolated from the high-voltage circuit in a direct current manner, includes a power supply voltage lower than a power supply voltage of the high-voltage circuit, and transmits a signal from the high-voltage circuit via an insulating element, wherein
the discharge wiring pair is not disposed in the high-voltage circuit but disposed in the low-voltage circuit.

7. The circuit board according to claim 6, wherein the discharge induction unit includes a covered part that covers a surface of a conductor part of the signal path with a dielectric film with a dielectric constant higher than that of air, and a non-covered part that does not cover a conductive pattern of the discharge wiring pair with the dielectric film.

8. The circuit board according to claim 6, wherein
the board is in a substantially rectangular planar shape including a pair of first outer edges being elongated in a first direction and a pair of second outer edges being elongated in a second direction orthogonal to the first direction,
a shortest distance between the interface and the second outer edge in the first direction is shorter than a shortest distance between the interface and the first outer edge in the second direction, and
the discharge wiring pair is disposed between the interface and the second outer edge located outside the interface in the first direction.

9. The circuit board according to claim 6, wherein
the board is attached to an attached part of a conductor by a screw, and
a ground path of the second discharge wire includes the screw.

* * * * *